(12) United States Patent
Nguyen

(10) Patent No.: US 7,172,711 B2
(45) Date of Patent: *Feb. 6, 2007

(54) INTERFACE MATERIALS AND METHODS OF PRODUCTION AND USE THEREOF

(75) Inventor: My N. Nguyen, Poway, CA (US)

(73) Assignee: Honeywell International, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 10/775,989

(22) Filed: Feb. 9, 2004

(65) Prior Publication Data

US 2004/0185273 A1    Sep. 23, 2004

Related U.S. Application Data

(60) Division of application No. 09/851,103, filed on May 7, 2001, now Pat. No. 6,706,219, and a continuation-in-part of application No. 09/774,466, filed on Jan. 30, 2001, and a continuation-in-part of application No. 09/398,989, filed on Mar. 9, 1999.

(51) Int. Cl.
*H01B 1/20* (2006.01)
*H01B 1/22* (2006.01)
*B32B 9/00* (2006.01)
*C08K 3/08* (2006.01)

(52) U.S. Cl. .............. 252/511; 252/500; 252/502; 252/518.1; 524/404; 524/413; 524/440; 428/112; 428/328; 428/343; 428/323; 528/10; 106/640; 106/641; 156/307.7; 361/704; 361/705; 361/706; 361/709

(58) Field of Classification Search .............. 252/500, 252/502, 511, 503, 512, 518.1, 519.1, 520.2; 524/404, 413, 440, 411; 428/112, 323, 343, 428/447, 328; 528/10; 106/638, 640, 641; 257/E23.107; 156/307.7, 325; 361/704–706

See application file for complete search history.

(56) References Cited

U.S. PATENT DOCUMENTS

| | | | | |
|---|---|---|---|---|
| 4,118,102 A | * | 10/1978 | Kuist et al. ............... 439/65 |
| 4,790,968 A | * | 12/1988 | Ohkawa et al. ........... 264/104 |
| 4,931,479 A | * | 6/1990 | Morgan ..................... 521/76 |
| 5,079,300 A | * | 1/1992 | Dubrow et al. ........... 525/106 |
| 5,109,771 A | * | 5/1992 | Lewis et al. ............... 101/453 |
| 5,227,093 A | * | 7/1993 | Cole et al. ................ 252/512 |
| 5,348,686 A | * | 9/1994 | Vyas ......................... 252/514 |
| 5,466,302 A | * | 11/1995 | Carey et al. .............. 136/251 |
| 5,492,863 A | * | 2/1996 | Higgins, III .............. 438/610 |
| 5,684,110 A | * | 11/1997 | Kawamura ................ 528/15 |
| 5,695,847 A | * | 12/1997 | Browne ..................... 428/112 |
| 5,837,119 A | * | 11/1998 | Kang et al. ................ 205/74 |
| 5,852,092 A | * | 12/1998 | Nguyen ..................... 524/404 |
| 5,879,794 A | * | 3/1999 | Korleski, Jr. ............. 428/317.1 |
| 5,890,915 A | * | 4/1999 | Reylek ...................... 439/91 |
| 6,284,817 B1 | * | 9/2001 | Cross et al. ............... 523/220 |
| 6,673,434 B2 | * | 1/2004 | Nguyen ..................... 428/323 |
| 6,792,382 B2 | * | 9/2004 | Kunitomo .................. 702/154 |

FOREIGN PATENT DOCUMENTS

| | | | |
|---|---|---|---|
| DE | 19640192 | * | 4/1998 |
| JP | 06-151480 | * | 5/1994 |
| JP | 08-176409 | * | 7/1996 |
| JP | 09-067518 | * | 3/1997 |

OTHER PUBLICATIONS

Data Sheets from Fluorochem, pp. 4, 2005.*
Data Sheet for Vinyl Fluids, Fluorochem, 2006, pp. 1-4.*
Data Sheet for Silanes and Silicones, UCT, 2006, pp. 218, 219, 235.*
International Search Report, PCT/US02/14613; Sep. 12, 2002.
Written Opinion; PCT/US02/14613; Apr. 11, 2003.
Response to Written Opinion; PCT/US02/14613; Jun. 9, 2003.
IPER; PCT/US02/14613; Sep. 9, 2003.

* cited by examiner

*Primary Examiner*—Mark Kopec
*Assistant Examiner*—Kallambella Vijayakumar
(74) *Attorney, Agent, or Firm*—Sandra P. Thompson; Buchalter Nemer

(57) ABSTRACT

An interface material comprising a resin mixture and at least one solder material is herein described. The resin material may comprise any suitable resin material, but it is preferred that the resin material be silicone-based comprising one or more compounds such as vinyl silicone, vinyl Q resin, hydride functional siloxane and platinum-vinylsiloxane. The solder material may comprise any suitable solder material, such as indium, silver, copper, aluminum and alloys thereof, silver coated copper, and silver coated aluminum, but it is preferred that the solder material comprise indium or indium-based compounds and/or alloys. The interface material, or polymer solder, has the capability of enhancing heat dissipation in high power semiconductor devices and maintains stable thermal performance. The interface material may be formulated by mixing the components together to produce a paste which may be applied by dispensing methods to any particular surface and cured at room temperature or elevated temperature. It can be also formulated as a highly compliant, cured, tacky elastomeric film or sheet for other interface applications where it can be preapplied, for example on heat sinks, or in any other interface situations.

22 Claims, No Drawings

INTERFACE MATERIALS AND METHODS OF PRODUCTION AND USE THEREOF

This application is a divisional of allowed application Ser. No. 09/851,103, filed May 7, 2001 now U.S. Pat. No. 6,706,219.

This continuation-in-part application claims the benefit of U.S. application Ser. No. 09/398,989 filed on Mar. 9, 1999 and Ser. No. 09/774,466 filed on Jan. 30, 2001 incorporated herein by reference in their entirety.

BACKGROUND

Electronic components are used in ever increasing numbers of consumer and commercial electronic products. Examples of some of these consumer and commercial products are televisions, personal computers, internet servers, cell phones, pagers, palm-type organizers, portable radios, car stereos, or remote controls. As the demand for these consumer and commercial electronics increases, there is also a demand for those same products to become smaller, more functional, and more portable for consumers and businesses.

As a result of the size decrease in these products, the components that comprise the products must also become smaller. Examples of some of those components that need to be reduced in size or scaled down are printed circuit or wiring boards, resistors, wiring, keyboards, touch pads, and chip packaging.

Components, therefore, are being broken down and investigated to determine if there are better building materials and methods that will allow them to be scaled down to accommodate the demands for smaller electronic components. In layered components, one goal appears to be decreasing the number of the layers at the same time increasing the layers routing density. This task can be difficult, however, given that several of the layers and components of the layers should generally be present in order to operate the device.

Thus, there is a continuing need to: a) design and produce layered materials that meet customer specifications while minimizing the size of the device and number of layers; and b) develop reliable methods of producing desired layered materials and components comprising those layered materials.

SUMMARY OF THE INVENTION

In accordance with the invention there is provided an interface material that comprises a resin mixture and at least one solder material. The resin material may comprise any suitable resin material, but it is preferred that the resin material be silicone-based comprising one or more compounds such as vinyl silicone, vinyl Q resin, hydride functional siloxane and platinum-vinylsiloxane. The solder material may comprise any suitable solder material, such as indium, silver, copper, aluminum, tin, bismuth, gallium and alloys thereof, silver coated copper, and silver coated aluminum, but it is preferred that the solder material comprise indium or indium-based compounds.

The interface material, or polymer solder, has the capability of enhancing heat dissipation in high power semiconductor devices and maintains stable thermal performance. It is not subject to interfacial delamination or phase separation during thermal-mechanical stresses or fluctuating power cycling of the electronic devices in which it is used.

The interface material may be formulated by mixing the components together to produce a paste which may be applied by dispensing methods to any particular surface and cured at room temperature or elevated temperature. It can be also formulated as a highly compliant, cured, tacky elastomeric film or sheet for other interface applications where it can be preapplied, for example on heat sinks, or in any other interface situations.

It may be also additionally useful to incorporate antioxidants to reduce oxidation of the polymer-based resins, wetability enhancing agents to promote wetting of surfaces, curing accelerators, such as those accelerators that would allow curing at room temperature, viscosity reducing agents to enhance dispersability and crosslinking aids. It is also sometimes desirable to include substantially spherical particles of filler to limit the compressibility of the interface material in interface applications, i.e. to limit or control the thickness of the material and of the layer.

It has been also found that thermal conductivity of solder systems, such as a combination of filler and the combined resin mixture discussed above, can be especially improved by incorporating carbon micro fibers, with other fillers, into the system.

DETAILED DESCRIPTION

An interface material can be produced that comprises a resin mixture and at least one solder material. The resin material may comprise any suitable resin material, but it is preferred that the resin material be silicone-based comprising one or more compounds such as vinyl silicone, vinyl Q resin, hydride functional siloxane and platinum-vinylsiloxane. The solder material may comprise any suitable solder material or metal, such as indium, silver, copper, aluminum, tin, bismuth, gallium and alloys thereof, silver coated copper, and silver coated aluminum, but it is preferred that the solder material comprise indium or indium-based compounds.

As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include such as indium, silver, copper, aluminum, tin, bismuth, gallium and alloys thereof, silver coated copper, and silver coated aluminum. The term "metal" also includes alloys, metal/metal composites, metal ceramic composites, metal polymer composites, as well as other metal composites. As used herein, the term "compound" means a substance with constant composition that can be broken down into elements by chemical processes.

Interface materials, as described herein, have several advantages directly related to use and component engineering, such as: a) the interface material/polymer solder material can be used to fill very small gaps on the order of 2 millimeters or smaller, b) the interface material/polymer solder material can efficiently dissipate heat in those very small gaps as well as larger gaps, unlike most conventional solder materials, and c) the interface material/polymer solder material can be easily incorporated into micro components, components used for satellites, and small electronic components.

Resin-containing interface materials and solder materials, especially those comprising silicone resins, that may also have appropriate thermal fillers can exhibit a thermal capability of less than 0.5 cm²° C./w. Unlike thermal grease, thermal performance of the material will not degrade after thermal cycling or flow cycling in IC devices because liquid silicone resins will cross link to form a soft gel upon heat activation.

Interface materials and polymer solders comprising resins, such as silicone resins, will not be "squeezed out" as thermal grease can be in use and will not display interfacial delamination during thermal cycling. The new material can be provided as a dispensable liquid paste to be applied by dispensing methods and then cured as desired. It can also be provided as a highly compliant, cured, and possibly cross-linkable elastomer film or sheet for pre-application on interface surfaces, such as heat sinks. Advantageously, fillers with a thermal conductivity of greater than about 2 and preferably at least about 4 w/m° C. will be used. Optimally, it is desired to have a filler of not less than about 10 w/m° C. thermal conductivity. The interface material enhances thermal dissipation of high power semiconductor devices. The paste may be formulated as a mixture of functional silicone resins and thermal fillers.

A vinyl Q resin is an activated cure specialty silicone rubber having the following base polymer structure:

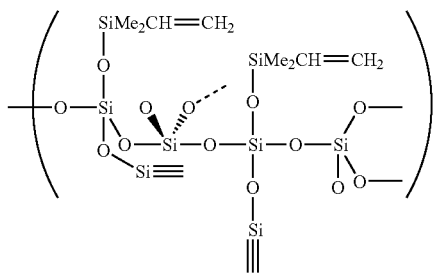

Vinyl Q resins are also clear reinforcing additives for addition cure elastomers. Examples of vinyl Q resin dispersions that have at least 20% Q-resin are VQM-135 (DMS-V41 Base), VQM-146 (DMS-V46 Base), and VQX-221 (50% in xylene Base).

As used herein, the term "compliant" encompasses the property of a material that is yielding and formable at room temperature, as opposed to solid and unyielding at room temperature. As used herein, the term "crosslinkable" refers to those materials or compounds that are not yet crosslinked.

As an example, a contemplated silicone resin mixture could be formed as follows:

| Component | % by weight | Note/Function |
| --- | --- | --- |
| Vinyl silicone | 75 (70–97 range) | Vinyl terminated siloxane |
| Vinyl Q Resin | 20 (0–25 range) | Reinforcing additive |
| Hydride functional siloxane | 5 (3–10 range) | Crosslinker |
| Platinum-vinylsiloxane | 20–200 ppm | Catalyst |

The resin mixture can be cured at either at room temperature or at elevated temperatures to form a compliant elastomer. The reaction is via hydrosilylation (addition cure) of vinyl functional siloxanes by hydride functional siloxanes in the presence of a catalyst, such as platinum complexes or nickel complexes. Preferred platinum catalysts are SIP6830.0, SIP6832.0, and platinum-vinylsiloxane.

Contemplated examples of vinyl silicone include vinyl terminated polydimethyl siloxanes that have a molecular weight of about 10000 to 50000. Contemplated examples of hydride functional siloxane include methylhydrosiloxane-dimethylsiloxane copolymers that have a molecular weight about 500 to 5000. Physical properties can be varied from a very soft gel material at a very low crosslink density to a tough elastomer network of higher crosslink density.

Solder materials that are dispersed in the resin mixture are contemplated to be any suitable solder material for the desired application. Preferred solder materials ate indium tin (InSn) complexes, indium silver (InAg) complexes and alloys, indium-based compounds, tin silver copper complexes (SnAgCu), tin bismuth complexes and alloys (SnBi), and aluminum-based compounds and alloys. Especially preferred solder materials are those materials that comprise indium.

Thermal filler particles may also be dispersed in the resin mixture. If thermal filler particles are present in the resin mixture, then those filler particles should advantageously have a high thermal conductivity. Suitable filler materials include silver, copper, aluminum, and alloys thereof; boron nitride, aluminum spheres, aluminum nitride, silver coated copper, silver coated aluminum, carbon fibers, and carbon fibers coated with metals, metal alloys, conductive polymers or other composite materials. Combinations of boron nitride and silver or boron nitride and silver/copper also provide enhanced thermal conductivity. Boron nitride in amounts of at least 20 wt. %, aluminum spheres in amounts of at least 70 wt. %, and silver in amounts of at least about 60 wt. % are particularly useful.

Of special efficacy is a filler comprising a particular form of carbon fiber referred to as "vapor grown carbon fiber" (VGCF) such as is available from Applied Sciences, Inc., Cedarville, Ohio. VGCF, or "carbon micro fibers", are a highly graphized type by heat treatment (thermal conductivity=1900 w/m° C.). Addition of about 0.5 wt. % carbon micro fibers provides significantly increased thermal conductivity. Such fibers are available in varying lengths and diameters; namely, 1 mm to tens of centimeters in length and from under 0.1 to over 100 µm in diameter. One useful form has a diameter of not greater than about 1 µm and a length of about 50 to 100 µm, and possesses a thermal conductivity of about two or three times greater than with other common carbon fibers having diameters greater than 5 µm.

It is difficult to incorporate large amounts of VGCF in resin systems such as the silicone resin mixture discussed above. When carbon micro fibers, e.g. (about 1 µm, or less, are added to the resins they do not mix well because of the need to incorporate a large amount of fiber relative to the amount of the resins for beneficial improvement of thermal conductivity. However, we have found that relative large amounts of carbon micro fibers can be added to resin systems that have relatively large amounts of other fillers. A greater amount of carbon micro fibers can be added to the resin when added with other fibers than can be added alone to the polymer, thus providing a greater benefit with respect to improving thermal conductivity of the thermal interface material. Desirably, if carbon micro fibers are present in the resin system, the ratio of carbon micro fibers to polymer is in the range of 0.05 to 0.50 by weight.

It may also be advantageous to incorporate substantially spherical filler particles to maximize packing density. Additionally, substantially spherical shapes or the like will also provide some control of the thickness during compaction. Dispersion of filler particles can be facilitated by the addition of functional organo metallic coupling agents or wetting agents, such as organosilane, organotitanate, organozirconium, etc. The organo metallic coupling agents, especially organotitanate, may also be used to facilitate melting of the solder material during the application process. Typical particle sizes useful for fillers in the resin material may be in the range of about 1–20 μm with a maximum of about 100 μm.

To illustrate the invention, a number of examples were prepared by mixing the components described in Examples A through J below. The examples shown include one or more of the optional additions, e.g., wetability enhancer. The amounts of such additions may vary but, generally, they may be usefully present in the following approximate amounts (in wt. %): filler up to 95% of total (filler plus resins); wetability enhancer 0.1 to 5% (of total); and adhesion promoters 0.01 to 1% (of total). It should be noted the addition at least about 0.5% carbon fiber significantly increases thermal conductivity. The examples also show various physico-chemical measurements for the contemplated mixtures.

Polymer Solder/Interface Material Examples

| | Example | | | | | | | | | |
|---|---|---|---|---|---|---|---|---|---|---|
| | A | B | C | D | E | F | G | H | I | J |
| Silicone Mixture | 16 | 5 | 8 | 5 | 5 | 5 | 5 | 5 | 4 | 4 |
| Organotitanate | 4 | 3 | 0 | 3 | 3 | 3 | 3 | 3 | 3 | 3 |
| InSn | | 92 | 92 | 82 | | | | | | |
| InAg | | | | | 63 | | | | | |
| In | | | | | | 63 | | | | |
| SnAgCu | | | | | | | 92 | 82 | | |
| SnBi | | | | | | | | | 83 | 68 |
| Al | 80 | | | 10 | 29 | 29 | | 10 | 10 | 25 |
| Modulus (MPa) | 25 | 15 | 25 | 15 | 20 | 23 | 25 | 30 | 20 | 25 |
| Viscosity (poises) | 1400 | 500 | 1200 | 450 | 1500 | 1600 | 500 | 750 | 650 | 1700 |
| Thermal Impedence (cm$^2$ ° C./w) | 0.3 | 0.15 | 0.4 | 0.14 | 0.14 | 0.12 | 0.16 | 0.17 | 0.18 | 0.10 |
| Thermal Conductivity (W/m ° C.) | 2.5 | 5.1 | 2.0 | 5.5 | 5.8 | 6.2 | 5.2 | 5.0 | 5.0 | 6.0 |

Components organotitanate, InSn, InAg, In, SnAgCu, SnBi, and Al are presented as weight percent or as wt. %.

Example A contains no solder material and is provided for reference purposes. Organotitanate is functioning not only as a wetting enhancer, but also as a fluxing agent to facilitate melting of the solder material during the application process.

The solder compositions for these examples are as follows: InSn=52% In (by weight) and 48% Sn (by weight) with a melting point of 118C; InAg=97% In (by weight) and 3% Ag (by weight) with a melting point of 143C; In=100% Indium (by weight) with a melting point of 157C; SnAgCu=94.5% Tin (by weight), 3.5% Silver (by weight) and 2% Copper (by weight) with a melting point of 217C; SnBi=60% Tin (by weight) and 40% Bismuth (by weight) with a melting point of 170C. It should be appreciated that other compositions comprising different component percentages can be derived from the subject matter contained herein.

The processing temperatures are as follows: Examples A–E=150C for 30 minutes; Examples F, J and I=200C for 30 seconds and 150C for 30 minutes; Examples G and H=240C for 30 seconds and 150C for 30 minutes.

Thus, specific embodiments and applications of interface materials and polymer solder materials have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

I claim:

1. An interface material for electronic devices selected from a group consisting of at least one compliant resin material and at least one solder material comprising indium, silver, copper, aluminum, tin, bismuth, gallium and alloys thereof, silver-coated copper, silver-coated aluminum and combinations thereof, wherein the at least one compliant resin material comprises a vinyl Q resin.

2. The interface material of claim 1, wherein the interface material comprises at least about 50 weight percent of the at least one complaint solder material further.

3. The interface material of claim 1, wherein the at least one resin material comprises a silicone resin.

4. The interface material of claim 3, wherein the silicone resin comprises a vinyl terminated siloxane, a reinforcing additive, a crosslinker and a catalyst.

5. The interface material of claim 4, wherein the vinyl terminated siloxane is vinyl silicone.

6. The interface material of claim 4, wherein the crosslinker comprises a hydride functional siloxane.

7. The interface material of claim 4, wherein the catalyst comprises a platinum complex.

8. The interface material of claim 7, wherein the platinum complex is a platinum-vinylsiloxane compound.

9. The interface material of claim 1, further comprising a wetting enhancer.

10. The interface material of claim 1, wherein the at least one solder material comprises an indium-based alloy or compound.

11. The interface material of claim 10, wherein the indium-based alloy or compound comprises InSn, InAg or In.

12. The interface material of claim 1, wherein the at least one solder material comprises a tin-based alloy or compound.

13. The interface material of claim 12, wherein the tin-based alloy or compound comprises SnAgCu or SnBi.

14. The interface material of claim 1, wherein the interface material comprises one of an aluminum or an aluminum-based alloy or compound.

15. The interface material of claim 1, further comprising a filler material.

16. The interface material of claim 15, wherein the filler material comprises carbon microfibers.

17. The interface material of claim 1, wherein the at least one resin material is also crosslinkable.

18. The interface material of claim 2, wherein the at least one solder material is present in an amount of at least about 60 weight percent.

19. The interface material of claim 18, wherein the at least one solder material is present in an amount of at least about 70 weight percent.

20. The interface material of claim 19, wherein the at least one solder material is present in an amount of at least about 80 weight percent.

21. A layered material comprising the interface material of claim 1.

22. A layered material comprising the interface material of claim 2.

* * * * *